(12) United States Patent
Wu et al.

(10) Patent No.: US 11,094,828 B2
(45) Date of Patent: Aug. 17, 2021

(54) GEOMETRY FOR THRESHOLD VOLTAGE TUNING ON SEMICONDUCTOR DEVICE

(71) Applicant: Taiwan Semiconductor Manufacturing Co., Ltd., Hsinchu (TW)

(72) Inventors: Chung-Chiang Wu, Taichung (TW); Wei-Chin Lee, Taipei (TW); Shih-Hang Chiu, Taichung (TW); Chia-Ching Lee, New Taipei (TW); Hsueh Wen Tsau, Zhunan Township (TW); Cheng-Yen Tsai, New Taipei (TW); Cheng-Lung Hung, Hsinchu (TW); Da-Yuan Lee, Jhubei (TW); Ching-Hwanq Su, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/907,570

(22) Filed: Jun. 22, 2020

(65) Prior Publication Data
US 2020/0321252 A1 Oct. 8, 2020

Related U.S. Application Data

(62) Division of application No. 15/993,210, filed on May 30, 2018, now Pat. No. 10,692,770.

(51) Int. Cl.
*H01L 29/78* (2006.01)
*H01L 21/8234* (2006.01)
*H01L 27/088* (2006.01)

(52) U.S. Cl.
CPC .. *H01L 29/7855* (2013.01); *H01L 21/823431* (2013.01); *H01L 21/823456* (2013.01); *H01L 21/823468* (2013.01); *H01L 27/0886* (2013.01)

(58) Field of Classification Search
CPC ............ H01L 21/8232; H01L 21/8234; H01L 21/823431; H01L 21/823437; H01L 21/823468; H01L 21/823456; H01L 21/8238; H01L 21/823821; H01L 21/823828; H01L 21/82385; H01L 27/085; H01L 27/088; H01L 27/0886; H01L 27/092; H01L 27/0924; H01L 27/10; H01L 27/105; H01L 27/1211; H01L 29/66; H01L 29/66007; H01L 29/68; H01L 29/76; H01L 29/772; H01L 29/785; H01L 29/7855
See application file for complete search history.

(56) References Cited

U.S. PATENT DOCUMENTS

2018/0122930 A1  5/2018  Okamoto et al.

*Primary Examiner* — Cheung Lee
(74) *Attorney, Agent, or Firm* — Slater Matsil, LLP

(57) ABSTRACT

Semiconductor device structures having gate structures with tunable threshold voltages are provided. Various geometries of device structure can be varied to tune the threshold voltages. In some examples, distances from tops of fins to tops of gate structures can be varied to tune threshold voltages. In some examples, distances from outermost sidewalls of gate structures to respective nearest sidewalls of nearest fins to the respective outermost sidewalls (which respective gate structure overlies the nearest fin) can be varied to tune threshold voltages.

20 Claims, 15 Drawing Sheets

GEOMETRY FOR THRESHOLD VOLTAGE TUNING ON SEMICONDUCTOR DEVICE

PRIORITY CLAIM AND CROSS-REFERENCE

This application is a divisional of U.S. application Ser. No. 15/993,210, filed on May 30, 2018, now U.S. Pat. No. 10,692,770, which application is hereby incorporated herein by reference.

BACKGROUND

As the semiconductor industry has progressed into nanometer technology process nodes in pursuit of higher device density, higher performance, and lower costs, challenges from both fabrication and design have resulted in the development of three dimensional designs, such as fin field effect transistors (FinFETs). A typical FinFET is fabricated with a fin extending from a substrate, for example, by etching into silicon of the substrate. The channel of the FinFET is formed in the vertical fin. A gate structure is provided over (e.g., overlying to wrap) the fin. It is beneficial to have a gate structure on the channel allowing gate control of the channel at the gate structure. FinFET devices provide numerous advantages, including reduced short channel effects and increased current flow.

As device dimensions continue scaling down, FinFET device performance can be improved by using a metal gate electrode instead of a typical polysilicon gate electrode. One process of forming a metal gate stack is implementing a replacement gate process (also called as a "gate-last" process) in which the final gate stack is fabricated "last". In some gate processes, voltage threshold tuning is achieved by deposition of metal films with different work functions correlated to the intrinsic properties and thicknesses of the metal films. As device dimensions shrink, threshold voltage (Vt) tuning with these techniques can become more difficult.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
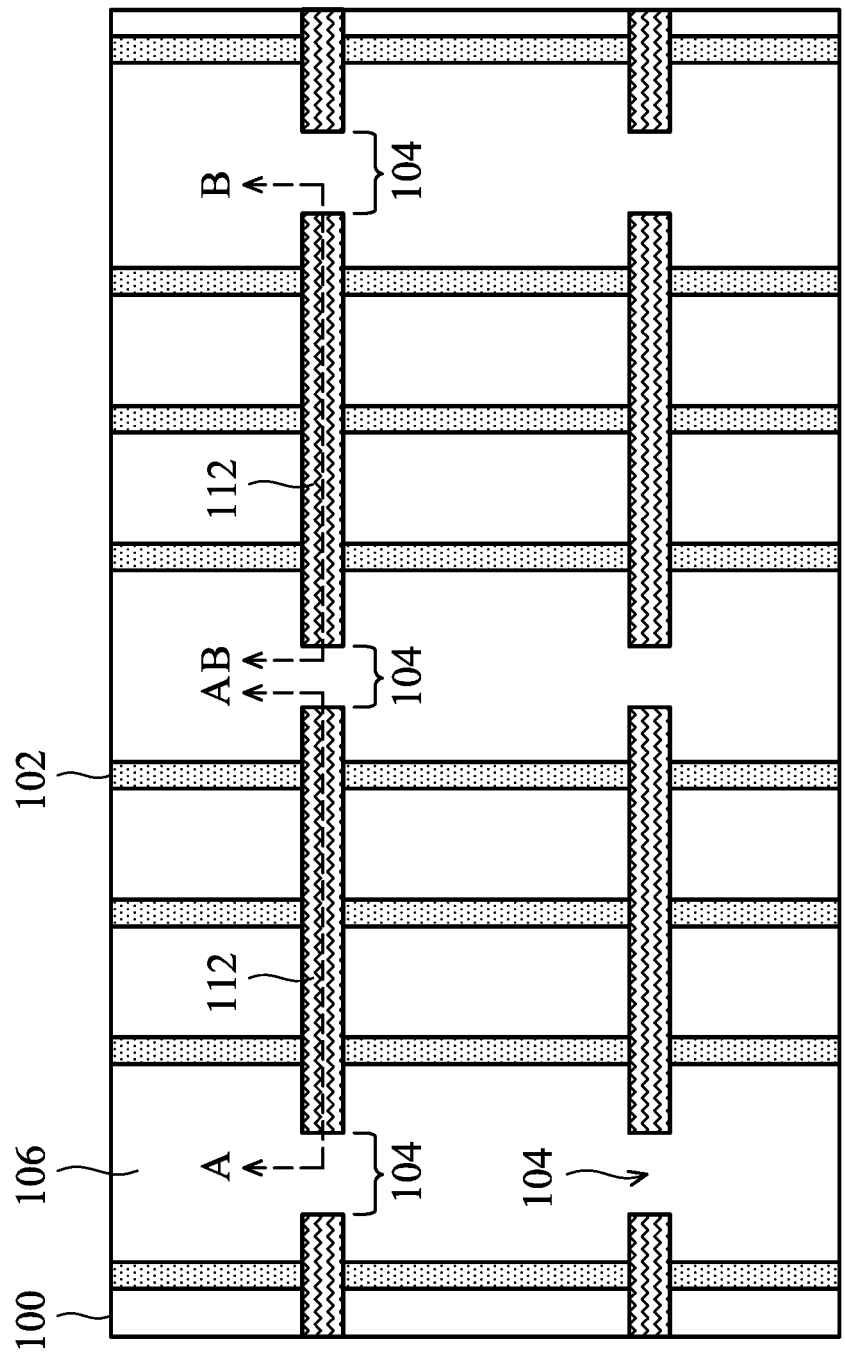
FIGS. 1A and 1B are a layout view and a three-dimensional view, respectively, of an intermediate structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to geometries in semiconductor devices for threshold voltage (Vt) tuning. The present disclosure provides methods for forming and structures formed with different geometries for gate structures, such as replacement gate structures in a replacement gate process, relative to underlying fins for threshold voltage tuning window enhancement. For example, threshold voltage tuning can be achieved by fin/gate geometries with varying distances from tops of fins to tops of gate structures and/or varying fin-to-gate sidewall distances. In some cases, different devices on a substrate can have different threshold voltages without the use of multiple work function metals.

Some examples described herein are in the context of fin field effect transistors (FinFETs). In other implementations, aspects described herein may be implemented in vertical, gate all around (VGAA) devices, horizontal, gate all around (HGAA) devices, or other devices. Further, embodiments may be implemented in any advanced technology nodes or other technology nodes.

In a replacement gate process for forming a replacement gate structure for a transistor, a dummy gate structure is formed over a substrate as a placeholder for the replacement gate structure that is subsequently formed. A gate spacer is formed along sidewalls of the dummy gate structure. After source/drain regions are formed in the substrate (such as in fins on the substrate) and after, among other things, an interlayer dielectric (ILD) is formed on the gate spacer, the dummy gate structure is removed, leaving an opening defined, at least in part, by the gate spacer and ILD. Then, a replacement gate structure is formed in the opening.

The replacement gate structure includes a gate dielectric layer such as a high-k (dielectric constant) dielectric layer, various optional conformal layers, and a gate metal fill. The various optional conformal layers can include barrier layers, capping layers, work function tuning layers, and other layers. Multiple deposition and patterning processes may be used to form the various optional conformal layers, for example, to tune the Vt of the transistor.

The Vt of a FET is generally the minimum gate-to-source voltage differential to create a conducting path between the source and drain regions of the device. Thus, if the magnitude of the gate voltage is below the magnitude of the Vt, the transistor may be "turned off," and (in ideal conditions) there is no current or is a small leakage current from the drain to the source of the transistor. If the magnitude of the gate-to-source voltage differential is above the magnitude of the Vt, then the transistor is "turned on", due to there being many carriers in the channel proximate the gate dielectric layer, creating a low-resistance channel where charge can flow from drain to source. Threshold voltage (Vt) tuning may refer to FET architecture design to control the Vt to achieve a desired Vt, for example, for improved power consumption and performance of devices.

Assuming all other conditions are equal for some technology nodes, varying the distance from a top of a fin to a top of a gate, such as by about 2 nm to about 3 nm, may adjust the Vt, such as by about 35 mV. Similarly, in some situations, varying the distance by about 4 nm may adjust the Vt by about 50 mV. Devices with a short channel and with a long channel may similarly have their respective Vts tune by varying the distance from respective tops of fins to tops of gates. In some instance, geometries having a large distance between a top of a fin to a top of a gate may have a larger Vt than geometries having a smaller such distance.

Similarly, varying a distance from a sidewall of a fin to a sidewall (e.g., a conductive sidewall) of the replacement gate structure may shift the work function. In some examples, a tuning window of about 100 mV can be achieved by adjusting the distance from the sidewall of the fin to a sidewall of the replacement gate structure. Geometries having a large distance from the sidewall of the fin to a sidewall of the replacement gate structure can have a smaller work function than geometries having a smaller such distance.

Thus, embodiments described herein may address Vt tuning using different geometries, such as geometries having different top-of-fin to top-of-gate distances, and/or geometries having different fin-to-gate sidewall distances.

Figure 1B:
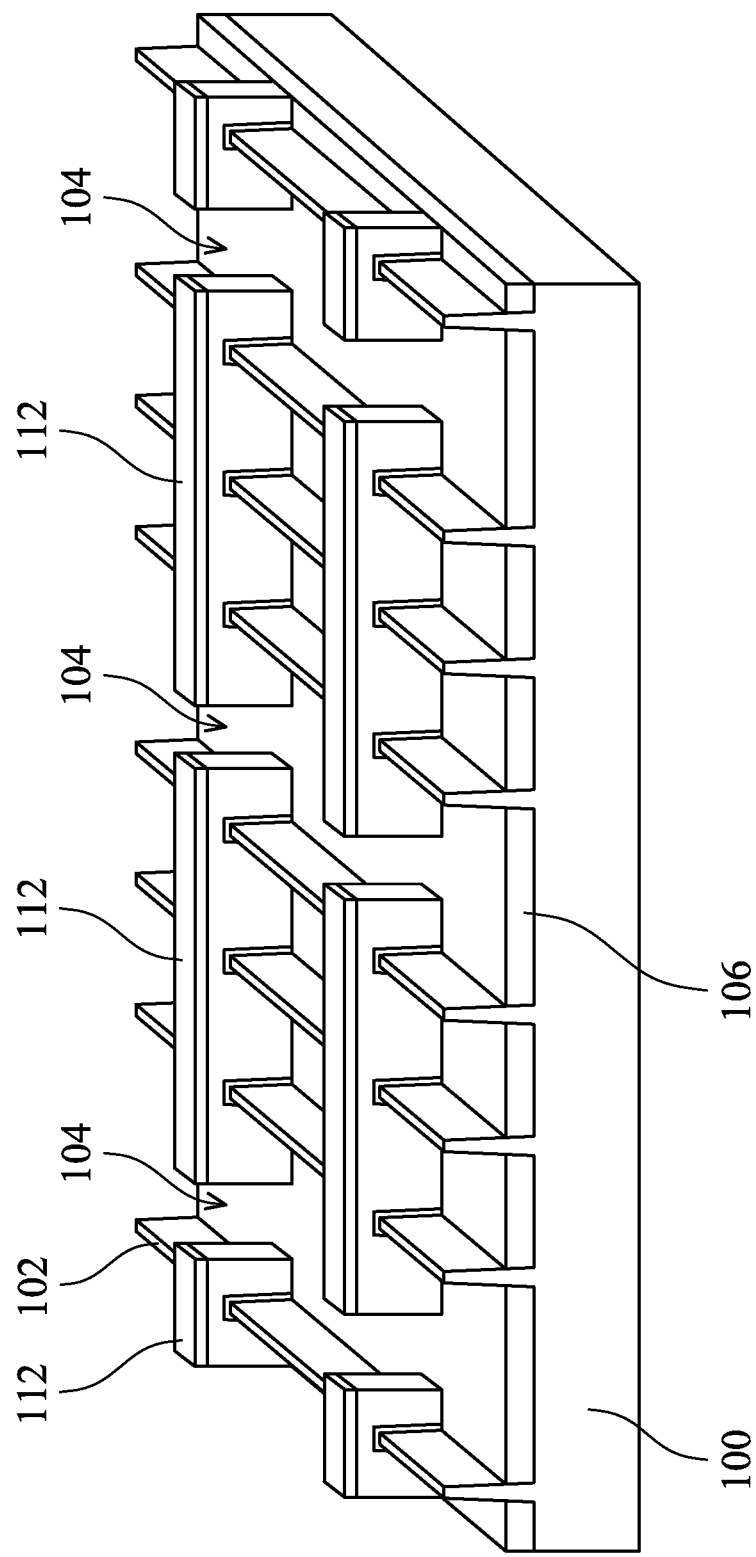

FIGS. 1A and 1B illustrate a layout view and a three-dimensional view of an intermediate structure in accordance with some embodiments. The intermediate structure in FIGS. 1A and 1B is shown to depict general features and aspects of structures of various embodiments described herein, which general features and aspects may not be apparent from the cross-sectional views of subsequent figures. Some of the general features and aspects shown in FIGS. 1A and 1B may be varied as described subsequently for the different embodiments. A person having ordinary skill in the art will readily understand how such variations may affect the various general features and aspects of FIGS. 1A and 1B.

FIGS. 1A and 1B show a substrate 100 having dummy gate structures 112 formed over a plurality of fins 102 formed on the substrate 100. As shown in FIGS. 1A and 1B, the dummy gate structures 112 are patterned to have respective separation regions 104 between separate, longitudinally neighboring dummy gate structures 112. Example methods of forming the structure of FIGS. 1A and 1B will become apparent from subsequent description of some embodiments.

FIG. 1A shows a cross-section A-A and a cross-section B-B. The cross-section A-A is along a first dummy gate structure 112 and across channel regions in a first group of fins in a first region of the substrate 100. The cross-section B-B is along a second dummy gate structure 112 and across channel regions in a second group of fins in a second region of the substrate 100. Subsequent figures denoted "A" illustrate cross-sectional views along a cross-section corresponding to cross-section A-A in FIG. 1A, and subsequent figures denoted "B" illustrate cross-sectional views along a cross-section corresponding to cross-section B-B in FIG. 1A. In some figures, some reference numbers of components or features illustrated therein may be omitted to avoid obscuring other components or features; this is for ease of depicting the figures.

FIGS. 2A-2B through 8A-8B are cross-sectional views of intermediate structures at intermediate stages in an example process of forming one or more FinFETs in accordance with some embodiments. In this example process, fins 102 with different fin heights are formed, which results in different distances from tops of fins 102 to tops of replacement gate structures, which can in turn tune Vts of devices that are formed.

Figure 2A:
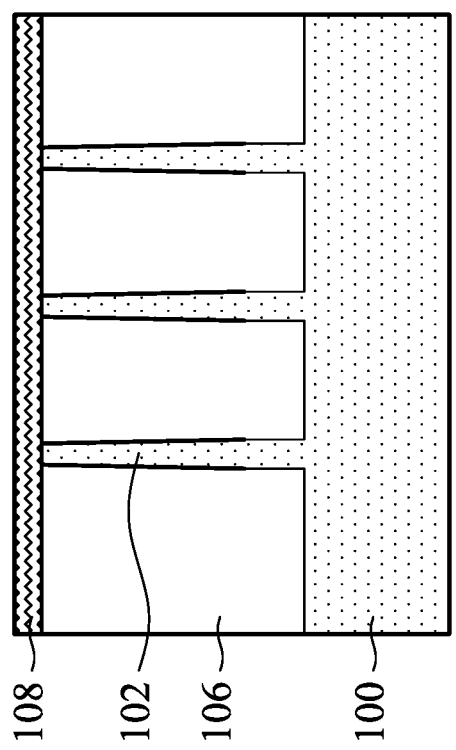
FIGS. 2A-2B, 3A-3B, 4A-4B, 5A-5B, 6A-6B, 7A-7B, and 8A-8B are cross-sectional views of intermediate structures at intermediate stages in an example process of forming one or more fin field effect transistors (FinFETs) in accordance with some embodiments.
Figure 2B:
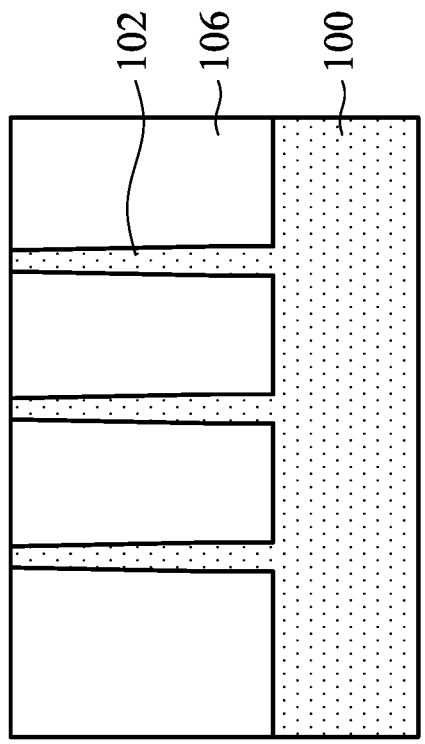

In FIGS. 2A and 2B, fins 102 are formed on the substrate 100. The substrate 100 can be or include a bulk semiconductor substrate, a semiconductor-on-insulator (SOI) substrate, or another substrate. The semiconductor material of the substrate 100 may be or include an elemental semiconductor like silicon (e.g., crystalline silicon like Si<100> or Si<111>) or germanium (Ge); a compound semiconductor; an alloy semiconductor; or a combination thereof. The semiconductor material may be doped or undoped, such as with a p-type or an n-type dopant.

The plurality of fins 102 may be formed by etching trenches in the substrate 100 to define the fins 102. The fins 102 are fabricated in the substrate 100 using suitable processes including masking, photolithography, and etch processes. In some examples, a mask (e.g., a hard mask) is used in forming the fins 102. For example, one or more mask layers are deposited over the substrate 100, and the one or more mask layers are then patterned into the mask. The one or more mask layers may include or be silicon nitride, silicon oxynitride, silicon carbide, silicon carbon nitride, the like, or a combination thereof, and may be deposited by chemical vapor deposition (CVD), physical vapor deposition (PVD), atomic layer deposition (ALD), or another deposition technique. The one or more mask layers may be patterned using photolithography and etching processes. The etch process may include a reactive ion etch (RIE), neutral beam etch (NBE), the like, or a combination thereof. The etching may be anisotropic. Subsequently, the photo resist is removed in an ashing process or wet strip processes, for example. The mask may be used to protect areas of the substrate 100 while an etch process forms the trenches into the substrate 100, leaving an extending fin, such as the fins 102. Numerous other embodiments of methods to form fins on a substrate may be utilized.

The trenches are then filled with isolating material 106. The isolating material 106 may isolate some regions of the substrate 100, e.g., active areas in the fins 102. In an example, the isolating material 106 may subsequently form shallow trench isolation (STI) structures and/or other suitable isolation structures. The isolating material 106 may be formed of silicon oxide, silicon nitride, silicon oxynitride, fluoride-doped silicate glass (FSG), and/or other suitable insulating material. The isolating material 106 may include a multi-layer structure, for example, having one or more liner layers. A chemical mechanical polish (CMP) process can be used to planarize a top surface of the isolating material 106 with the top of the fins 102.

As shown in FIGS. 2A and 2B, the fins 102 are formed having a same height. In some embodiments, each fin 102 in FIGS. 2A and 2B has a width of approximately 10 nanometer (nm) and a height in a range from approximately 10 nm to 60 nm, such as about 50 nm. However, it should be understood that other dimensions may be used for the fins 102.

According to certain aspects, another masking and etch process can be performed on the fins 102 to form fins of a different height. For example, as shown in FIGS. 2A and 2B, a mask layer 108 can be patterned over the group of the fins 102 in the first region of FIG. 2A, while another group of fins 102 in the second region of FIG. 2B are left exposed. In some examples, the mask layer 108 can include a photoresist deposited on over the isolating material 106 and fins 102, which can be patterned by a photolithography process. After patterning the mask layer 108, the mask layer 108 may then be used to protect regions of the substrate 100 while an etch process can be used to etch the exposed fins 102.

Figure 3B:
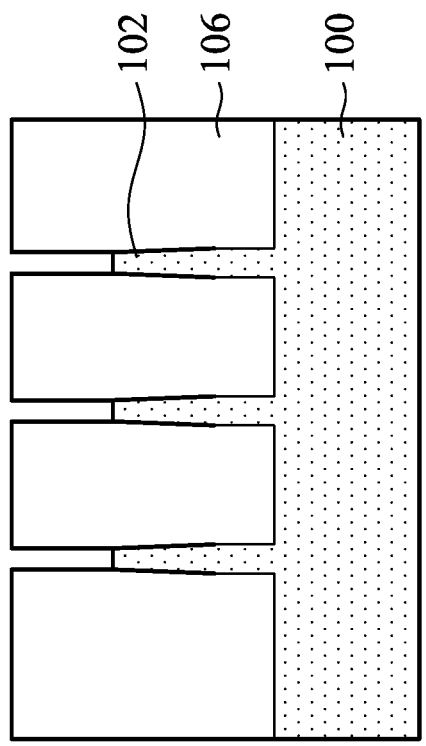
Figure 3A:
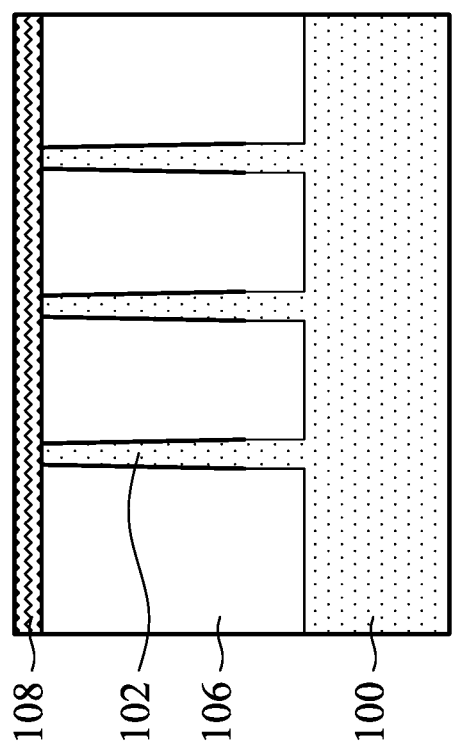

As shown in FIGS. 3A and 3B, an etch process can be performed. The mask layer 108 protects the fins 102 under the mask layer 108 during the etch process as shown in FIG. 3A. The etch process is selective to etch the materials of the fins 102. An example etch process is a wet etch process implementing a solution including diluted potassium hydroxide (KOH) or tetra-methyl-ammonium hydroxide (TMAH). The KOH- or TMAH-solutions may be diluted in deionized water (DIW) at a ratio in a range from about 1:10 (parts KOH or TMAH:parts DIW) to about 1:100. The etch process may be performed by rinsing or immersing the structure in the solution. The solution may be at a temperature in a range from about 20° C. to about 70° C. The etch process may remove portions of the fins 102 in the unprotected areas of the substrate 100 and may not significantly etch the isolating material 106, as shown in FIG. 3B. The duration of the etch process can be controlled to remove a desired amount of the fins 102.

Figure 4A:
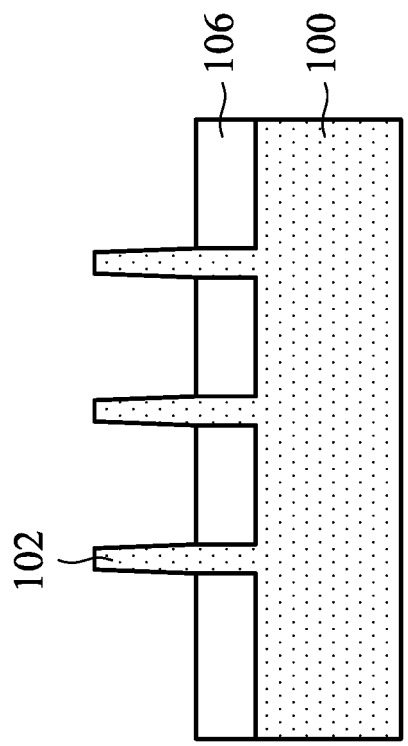
Figure 4B:
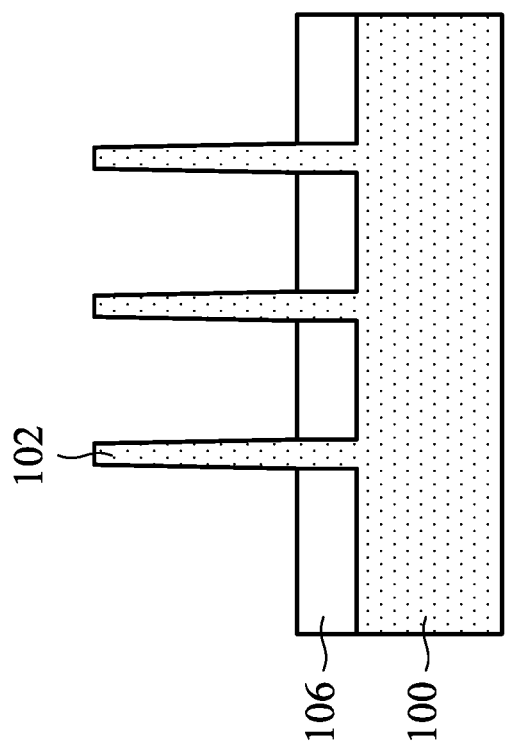

A plasma ashing process can be used to remove the mask layer 108 as shown in FIGS. 4A and 4B. An etch process selective to the material of the isolating material 106 can then be used to recess the isolating material 106 as shown FIGS. 4A and 4B while not significantly etching the fins 102. An example etch process is a wet etch process implementing a solution including diluted buffered oxide etch (BHF or BOE). The BOE may be diluted in DIW at a ratio in a range from about 1:10 (parts BOE:parts DIW) to about 1:100. The etch process may be performed by rinsing or immersing the structure in the solution. The solution may be at a temperature in a range from about 20° C. to about 80° C. The duration of the etch process can be controlled to remove a desired amount of the isolating material 106.

As shown in FIGS. 4A and 4B, the masking and etching of the substrate 100 results in fins 102 with varying heights. For example, as shown, the fins 102 in the first region of the substrate 100 shown in FIG. 4A have a greater height than the height of the fins 102 on the second region of the substrate 100 shown in FIG. 4B.

Although two regions the substrate 100 having fins with two different heights are shown in FIGS. 4A and 4B, in some examples, more than two regions of the substrate 100 can be patterned and etched to form fins having more than two different heights.

In addition, although FIGS. 2A-2B through 4A-4B show formation of fins having varying heights before formation of the dummy gate structure 112, in some examples, the fins 102 can be patterned and etched to different heights after removal of the dummy gate structure 112 and before formation of the replacement gate structure, as will be described in more detail below.

As stated, the etching in FIGS. 3A and 3B can form fins 102 with different heights for some embodiments. In other embodiments, fins 102 in different regions are formed with the same height, such as by performing the processing described with respect to FIGS. 2A-2B through 4A-4B but omitting the formation of the mask layer 108 in FIGS. 2A and 2B and the etch process in FIGS. 3A and 3B.

Figure 5A:
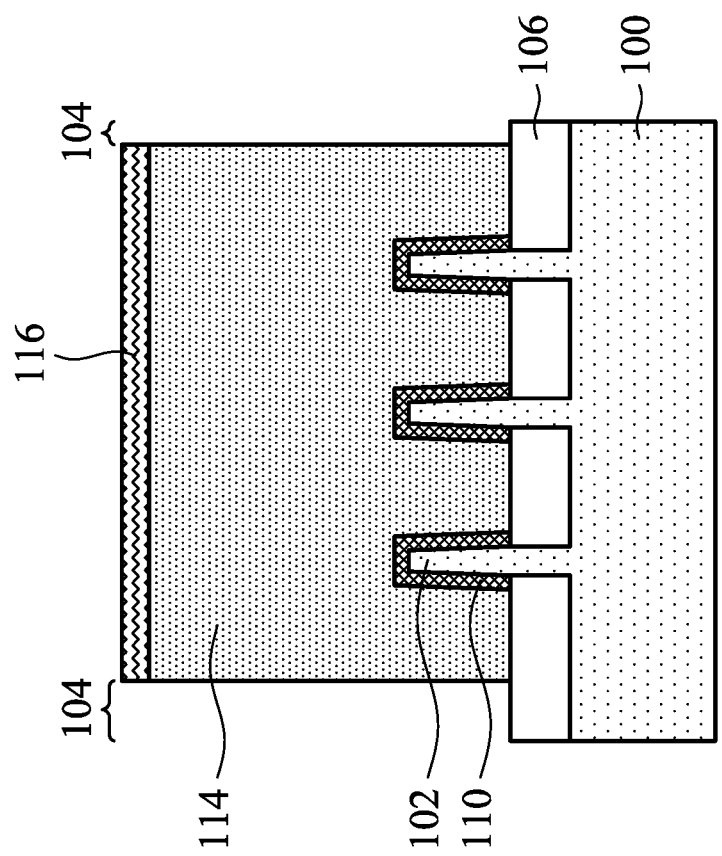
Figure 5B:
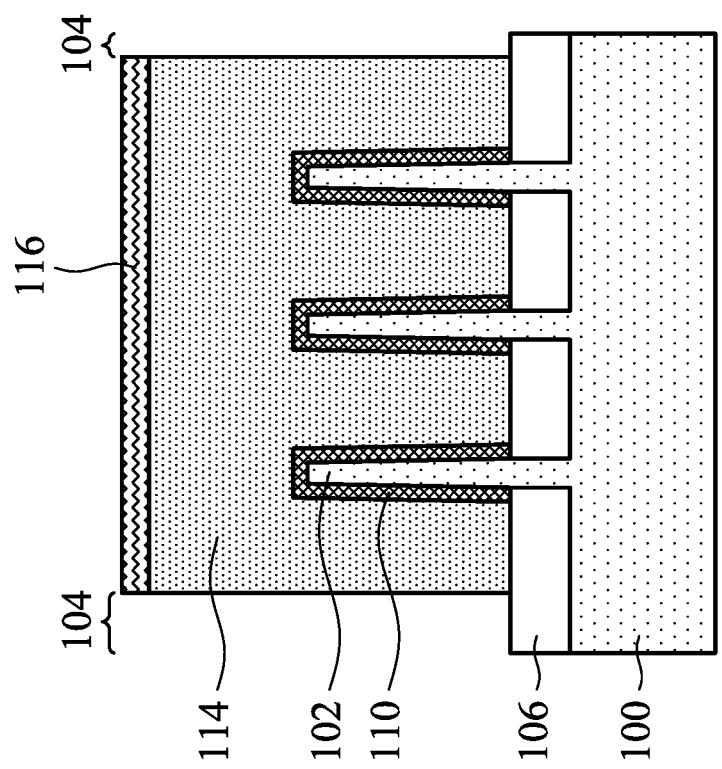

As shown in FIGS. 5A and 5B, the dummy gate structure 112 is formed over the fins 102. The dummy gate structure 112 includes an interfacial dielectric layer 110 formed over the fins 102, a dummy gate layer 114 formed over the interfacial dielectric layer 110, and a hardmask layer 116 formed on the dummy gate layer 114. The various layers in the dummy gate structure 112 may be formed by suitable deposition techniques and patterned by suitable photolithography and etch processes. The dummy gate structure 112 engages the fins 102 on two or three sides of the fin 102.

The interfacial dielectric layer 110 can be a dielectric oxide layer. For example, the dielectric oxide layer may be formed by chemical oxidation, thermal oxidation, ALD, CVD, and/or other suitable methods. The dummy gate layer 114 may be a polysilicon layer or other suitable layers. For example, the dummy gate layer 114 may be formed by suitable deposition processes such as low-pressure CVD (LPCVD), plasma-enhanced CVD (PECVD), or other deposition techniques. The hardmask layer 116 may be any material suitable to pattern the dummy gate structure 112 with desired features/dimensions on the substrate.

The dummy gate structures 112 in FIGS. 5A and 5B (and correspondingly in FIGS. 1A and 1B) are depicted and described as being patterned as separate dummy gate structures 112. More particularly, the patterning of the dummy gate structures 112 forms the separation regions 104 shown in FIGS. 1A, 1B, 5A, and 5B. In other embodiments, individual dummy gate structures 112 may be deposited and patterned across multiple regions of the substrate 100, such as a single dummy gate structure 112 being formed across the cross-sectional views of FIGS. 5A and 5B. Subsequently, such as after formation of gate spacers and an ILD, the dummy gate structures 112 or corresponding replacement gate structures can be cut to form the separate dummy gate structures 112, as will be described in more detail below.

Gate spacers are formed on sidewalls of the dummy gate structures 112. In some embodiments, the gate spacer includes a dielectric material, such as silicon nitride (SiN), silicon oxynitride (SiON), silicon carbon nitride (SiCN), silicon oxycarbonitride (SiOCN), or the like. In an example, the gate spacer may be a single layer or multiple layers. In an embodiment, after the dummy gate structure 112 is formed, one or more spacer layers are formed by conformally depositing spacer materials over the device structure. Subsequently, an anisotropic etch process is performed to remove portions of the spacer layers to form the gate spacer.

After the gate spacer is formed, one or more recessing and epitaxial growth processes may be performed to grow epitaxy source/drain regions (not shown) in the fins 102 on opposing sides of respective dummy gate structures 112. The epitaxial growth process may in-situ dope the epitaxy source/drain regions with a p-type dopant for forming a p-type device region or an n-type dopant for forming an n-type device region.

A contact etch stop layer (CESL) and a first ILD are then sequentially formed on the epitaxy source/drain regions, the gate spacers, and dummy gate structures 112. The CESL is conformally deposited on surfaces of the epitaxy source/drain regions, sidewalls and top surfaces of the gate spacers, and top surfaces of the dummy gate structures 112 and isolating material 106. The CESL may comprise or be silicon nitride, silicon carbon nitride, silicon carbon oxide, carbon nitride, the like, or a combination thereof, and may be deposited by CVD, PECVD, ALD, or another deposition technique. The first ILD is then deposited on the CESL. The first ILD may include materials such as tetraethylorthosilicate (TEOS) oxide, un-doped silicate glass, doped silicon oxide such as borophosphosilicate glass (BPSG), fused silica glass (FSG), phosphosilicate glass (PSG), boron doped silicon glass (BSG), and/or other suitable dielectric materials. The first ILD may be deposited by a PECVD process, high density plasma CVD (HDP-CVD) process, or other suitable deposition technique. A planarization process, such as a CMP, may then be performed to planarize top surfaces of the first ILD, CESL, and dummy gate layer 114 to form those top surfaces to be coplanar and thereby remove the hardmask layer 116 and expose the dummy gate layer 114.

Figure 6A:
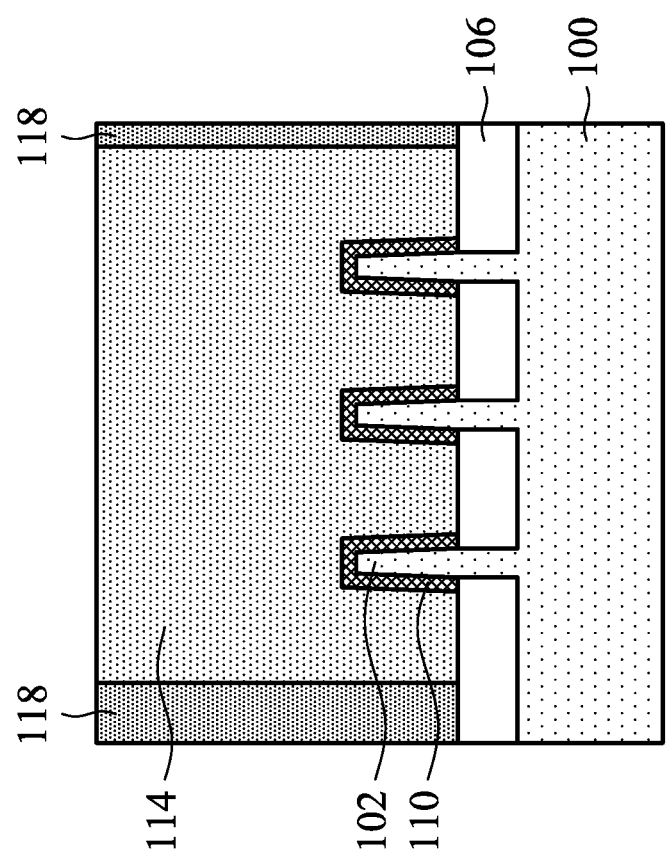
Figure 6B:
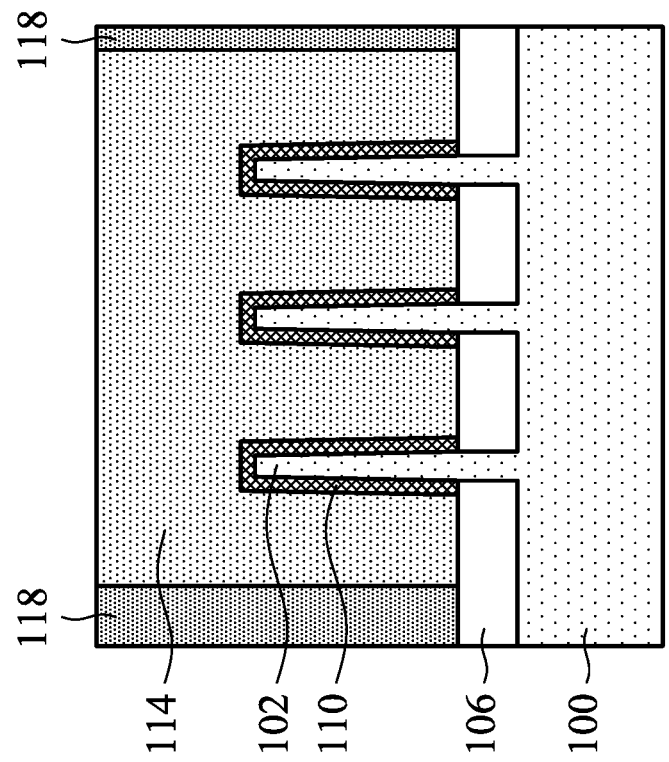

As described previously and as depicted in FIGS. 5A and 5B, the separation regions 104 are formed by the patterning of the dummy gate structures 112 before formation of, e.g., the gate spacers, CESL, and first ILD. Hence, in these embodiments, the separation regions 104 may be filled with, from the respective sidewalls of the dummy gate structures 112 in a direction away from the dummy gate structures 112, a respective gate spacer, the CESL, and/or the first ILD. In these examples, the filling of the separation regions 104 by a gate spacer, CESL, and/or first ILD is generally shown as dielectric structure 118 in FIGS. 6A and 6B.

In other embodiments where individual dummy gate structures 112 are deposited and patterned across multiple regions of the substrate 100, a gate cut process may be performed after the planarization process to planarize the first ILD, CESL, and dummy gate layer 114 (and thereby expose the dummy gate layer 114). Appropriate photolithography and etch processes may be implemented to cut the dummy gate structures 112 into separate dummy gate structures 112 and form the separation regions 104, which may further be through portions of the first ILD, CESL, and gate spacers. A dielectric material, such as silicon nitride, silicon oxide, silicon oxynitride, the like, or a combination thereof, may then be deposited in the separation regions 104 and planarized to remove excess of the dielectric material to form gate-cut fill structures. Hence, in these embodiments, the separation regions 104 may be filled with gate-cut fill structures. In these examples, the filling of the separation regions 104 by gate-cut fill structures is generally shown as dielectric structure 118 in FIGS. 6A and 6B.

Figure 7A:
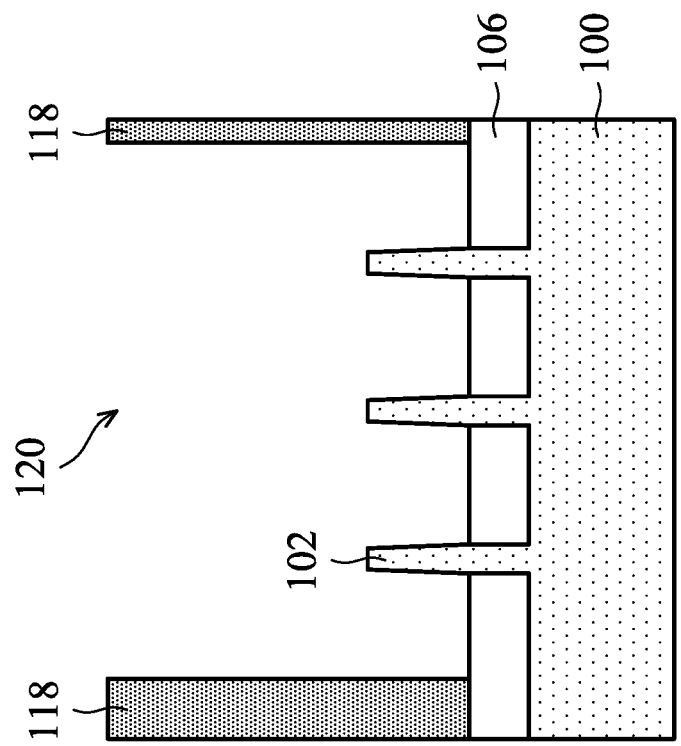
Figure 7B:
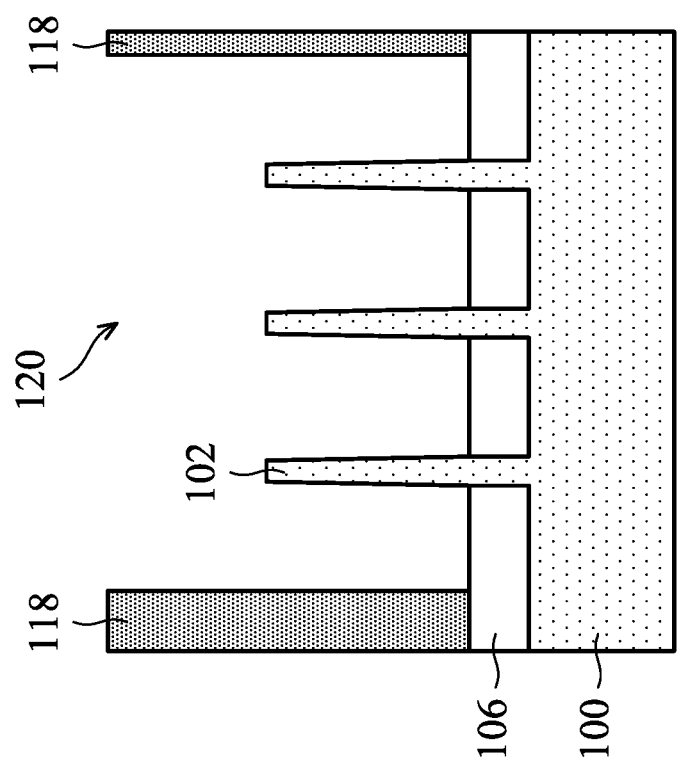

As shown in FIGS. 7A and 7B, the dummy gate structures 112 are removed from the substrate 100 to define openings 120 between sidewalls of the respective dielectric structures 118. In the embodiment shown in FIGS. 7A and 7B, the openings 120 expose respective upper surfaces of the isolating material 106 and sidewalls and top surfaces of the fins 102 above the surface of the isolating material 106.

The dummy gate structure 112 may be removed using etch processes. The etch processes may include a suitable wet etch, dry (plasma) etch, and/or other processes. For example, a dry etch process may use chlorine-containing gases, fluorine-containing gases, other etching gases, or a combination thereof. The wet etching solutions may include NH$_4$OH, HF (hydrofluoric acid) or diluted HF, deionized water, TMAH (tetramethylammonium hydroxide), other suitable wet etching solutions, or combinations thereof.

In the illustrated embodiment, the fins 102 in different regions are formed with different fin heights in FIGS. 2A-2B through 4A-4B. Although not shown, in some examples, the fins 102 in different regions can be formed with the same fin height, such as by omitting formation of the mask layer 108 in FIGS. 2A and 2B and the etch process in FIGS. 3A and 3B, and the fins 102 in different regions can be etched after removal of the respective dummy gate structure 112 to vary the fin heights where the replacement gate structure will be formed in the different regions. For example, regions where the heights of fins 102 are not to be changed can be masked, and in regions where the heights of fins 102 are to be reduced, an appropriate etch process can be performed to remove the dummy gate structures 112, as described above. Then, with the mask remaining in the regions where the heights of fins 102 are to remain unchanged, an etch process selective to the materials of the fin 102 can be performed to reduce the heights of the fins 102 where the dummy gate structures 112 were removed. The etch process can be any suitable etch process, which may be anisotropic or isotropic. If an isotropic etch is to be performed, widths of the fins 102 to be etched may be initially formed larger than other fins 102 that are not to be etched to accommodate the isotropic nature of the etch process. Subsequently, the regions where the heights of fins 102 were reduced may be masked while dummy gate structures 112 in other regions are removed by appropriate etch processes. Multiple iterations of these steps may be performed to achieve any number of different fin heights.

Figure 8B:
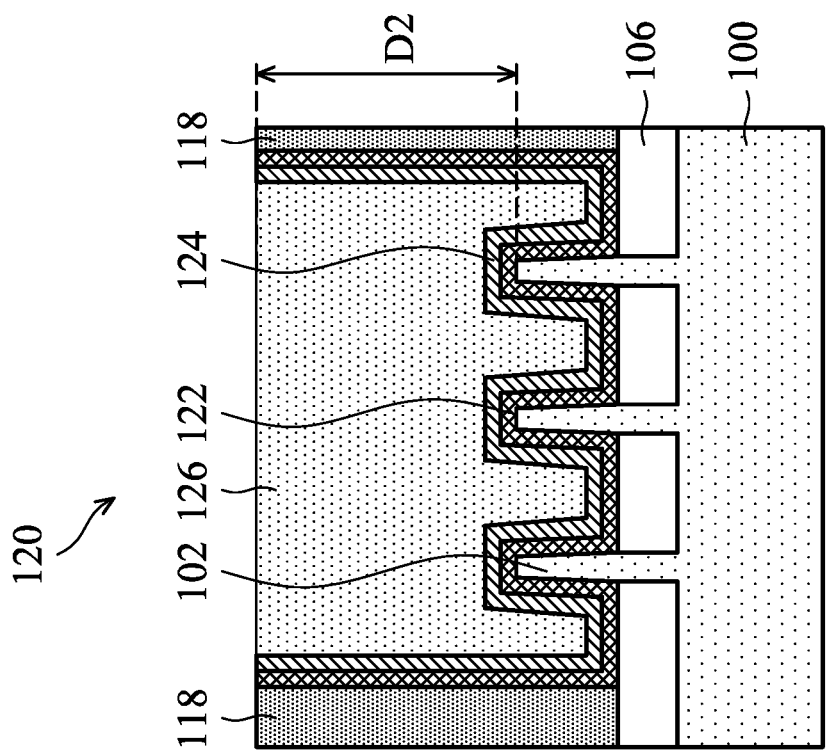
Figure 8A:
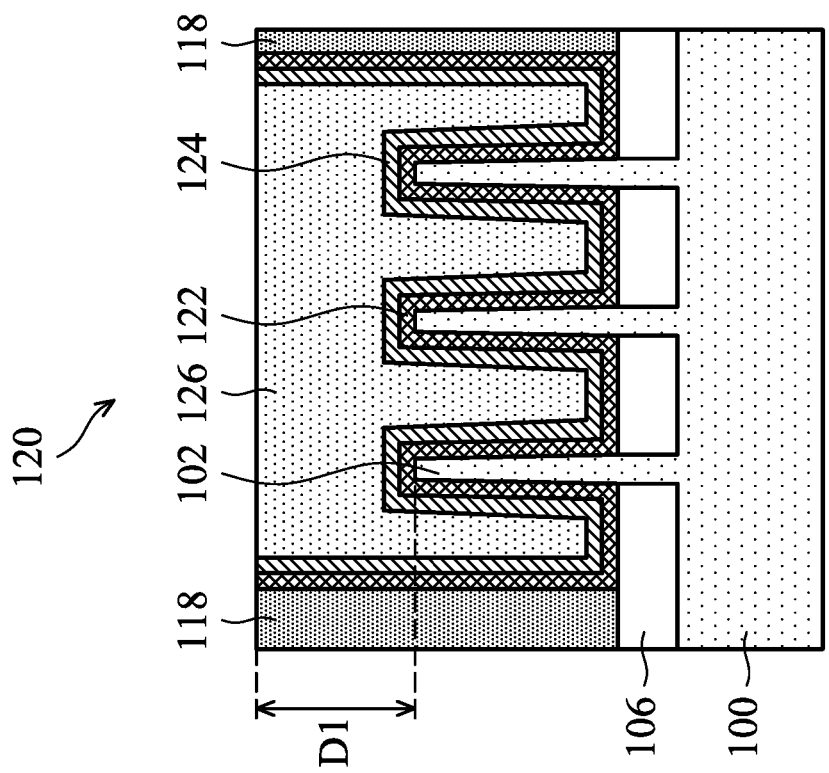

As shown in FIGS. 8A and 8B, respective replacement gate structures are formed in the openings 120. Each replacement gate structure includes, as illustrated, a gate dielectric layer 122, one or more optional conformal layers 124 over the gate dielectric layer 122, and a gate metal fill 126 over the one or more optional conformal layers 124. The gate dielectric layer 122 is formed over the fins 102, over the isolating material 106, and along sidewalls of the dielectric structure 118. The gate dielectric layer 122 may be a high-k (dielectric constant) dielectric layer such as HfO$_2$, Al$_2$O$_3$, LaO$_2$, TiO$_2$, HfZrO, Ta$_2$O$_3$, HfSiO$_4$, ZrO$_2$, ZrSiO$_2$, combinations thereof, or other suitable material. The one or more optional conformal layers 124 may include a barrier layer, a capping layer, and/or a work function tuning layer. The barrier layer and capping layer may each be a nitride, silicon nitride, carbon nitride, and/or aluminum nitride of tantalum and/or titanium layer, or a combination thereof. The work function tuning layer may be TiN, TSN, WN, WCN, AlN, TaAlC, TiAl, TiAlN, WAlN, other suitable materials, or a combination thereof. The gate metal fill 126 may be W, Co, Ru, Al, or other suitable fill material. In some examples, multiple deposition and patterning processes may be implemented to form various work function tuning layers to tune the Vts of the transistors. Embodiments provide further Vt tuning using different geometries, such as described herein. Thus, in some cases multiple Vt tuning can be achieved without multiple work function tuning layers.

A CMP process may be performed to remove excess materials from the replacement gate structure so as to planarize a top surface of the device structure, as shown in FIGS. 8A and 8B. After the CMP process, the top surfaces of the fins 102 in the region of the substrate 100 shown in FIG. 8A are a greater distance from the top surface of the replacement gate structure than the fins 102 in the different region of the substrate 100 shown in FIG. 8B. As illustrated, a first distance D1 is between tops of fins 102 in the region of FIG. 8A and the top of the corresponding replacement gate structure (e.g., the gate metal fill 126), and a second distance D2 is between tops of fins 102 in the region of FIG. 8B and the top of the corresponding replacement gate structure (e.g., the gate metal fill 126). The second distance D2 is greater than the first distance D1, which may be used to implement different Vts between the devices formed in the different regions.

FIGS. 9A-9B and 10A-10B are cross-sectional views of intermediate structures at intermediate stages in another example process of forming one or more FinFETs in accordance with some embodiments. In some examples, as shown in FIGS. 9A-9B and 10A-10B, various replacement gate structures can be etched back to form different regions of the substrate 100 having varying distances from tops of fins 102 to tops of the replacement gate structure for Vt tuning.

Figure 9B:
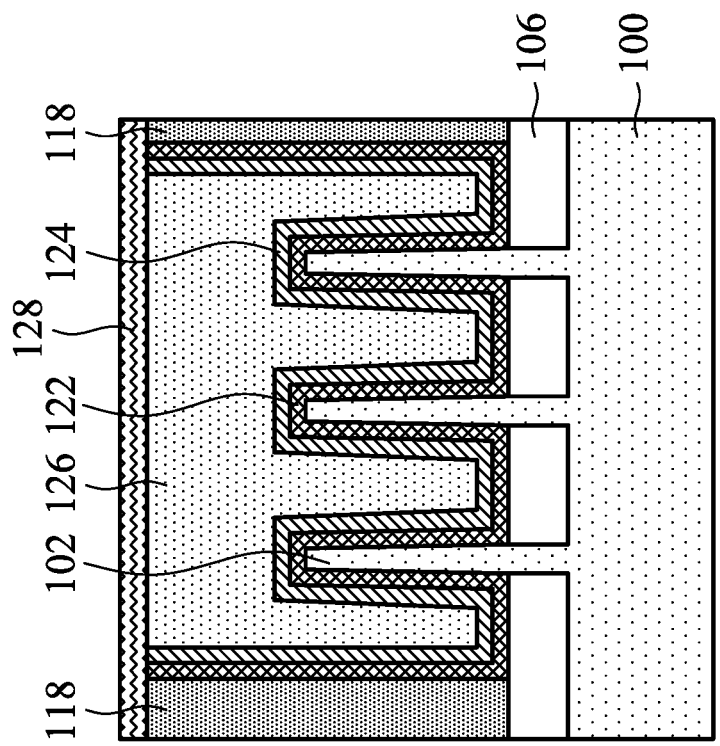
FIGS. 9A-9B and 10A-10B are cross-sectional views of intermediate structures at intermediate stages in another example process of forming one or more FinFETs in accordance with some embodiments.
Figure 9A:
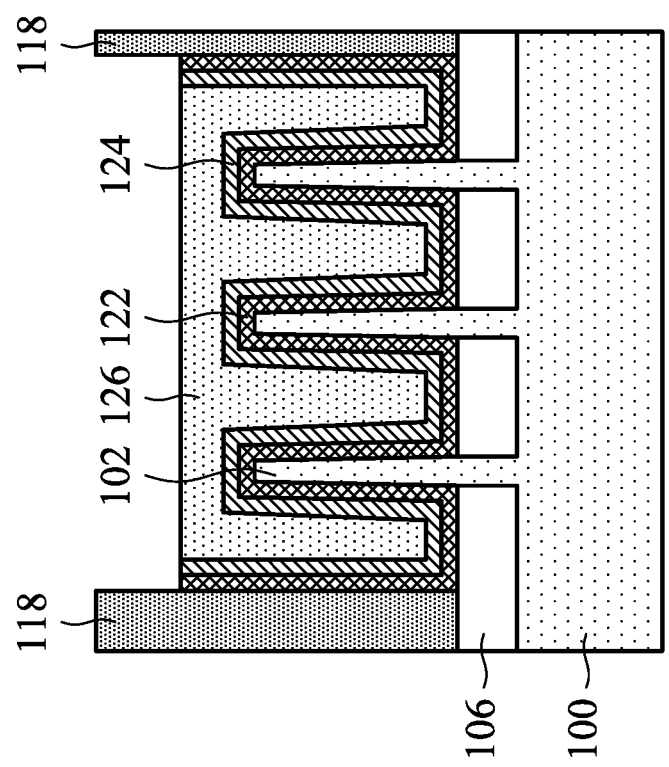

As shown in FIGS. 9A and 9B, the fins 102 can be formed having a same height, as previously described. The dummy gate structures can be formed and removed, and the replacement gate structures can be formed, as previously described above, but over the fins 102 of the same height.

In some examples, the replacement gate structures in different regions can be etched back to different depths in order to reduce the distance between tops of fins to the top of a replacement gate structure. For example, in the region of the substrate 100 shown in FIG. 9B, a mask layer 128 is formed on the surface of the replacement gate structure over the dielectric structure 118 and replacement gate structure, while in the region of the substrate 100 shown in FIG. 9A, the replacement gate structure is left uncovered by the mask layer 128. The mask layer 128 can be any appropriate material deposited and patterned using any appropriate processes. Thus, the portion of the substrate 100 shown in FIG. 9B is protected while the replacement gate structure shown in FIG. 9A can then be etched. The etch process implemented to etch back the replacement gate process can be selective to the materials of the replacement gate structure. The etch back may be or include a dry (e.g., plasma) etch process. The plasma etch process may include a RIE, NBE, inductively coupled plasma (ICP) etch, the like, or a combination thereof. Example etchant gases that can be used for a plasma etch process include tetrafluromethane ($CF_4$) gas, hexafluroethane ($C_2F_6$) gas, or another etchant gas. The depth of the etch back can be controlled by a duration of the etch process used for the etch back.

Figure 10A:
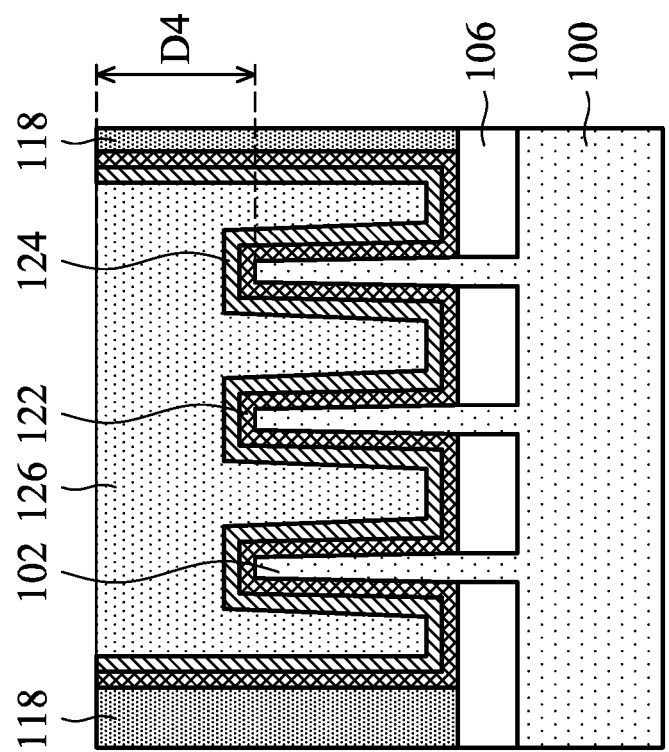

As shown in FIG. 10A, a dielectric capping material 130, such as silicon nitride, silicon oxide, silicon oxynitride, the like, or a combination thereof, is deposited over the substrate 100 to fill the recess the replacement gate structure was etched back. A CMP process may be performed to remove excess dielectric material such that the dielectric capping material 130 has a top surface coplanar with top surfaces of, e.g., the dielectric structure 118 (e.g., the first ILD). The mask layer 128 can be removed before the dielectric capping material 130 is deposited, or after the dielectric capping material 130 is deposited, such as by the CMP.

Figure 10B:
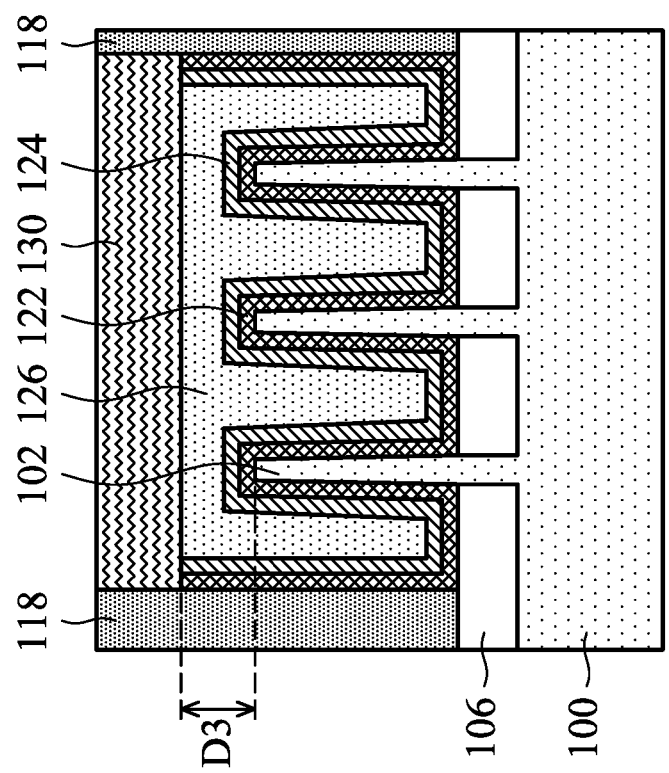

After the etch back, the distance between the top of the fins 102 and the top of the replacement gate structure in the region shown in FIG. 10A is smaller than the corresponding distance in the region of the substrate 100 shown in FIG. 10B. As illustrated, a third distance D3 is between tops of fins 102 in the region of FIG. 10A and the top of the corresponding replacement gate structure (e.g., the gate metal fill 126), and a fourth distance D4 is between tops of fins 102 in the region of FIG. 10B and the top of the corresponding replacement gate structure (e.g., the gate metal fill 126). The fourth distance D4 is greater than the third distance D3, which may be used to implement different Vts between the devices formed in the different regions.

Although two substrate portions having two different distances between tops of fins and tops of replacement gate structures are shown in FIGS. 10A and 10B, in some examples, any number of such distances can be formed by performing multiple masking and etch back processes for different regions of the substrate 100. Further, although the masking and etch back of the replacement gate structures is shown in FIGS. 9A-9B and 10A-10B as being performed with fins 102 having the same height in different regions, in some examples, the masking and etch back of the replacement gate structures can be performed with fins 102 of different heights in different regions. In other words, the process shown in FIGS. 2A-2B through 8A-8B can be performed in addition to the process shown in FIGS. 9A-9B and 10A-10B to achieve varying distances from tops of fins 102 to tops of the replacement gate structures for Vt tuning.

Figure 11A:
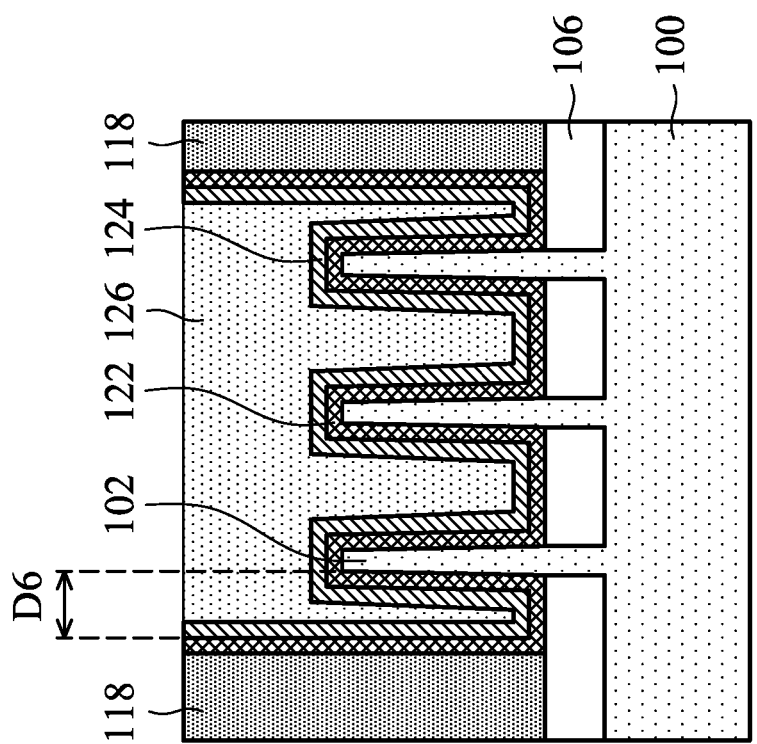
FIGS. 11A and 11B are cross-sectional views of an intermediate structure at an intermediate stage in another example process of forming one or more FinFETs in accordance with some embodiments.
Figure 11B:
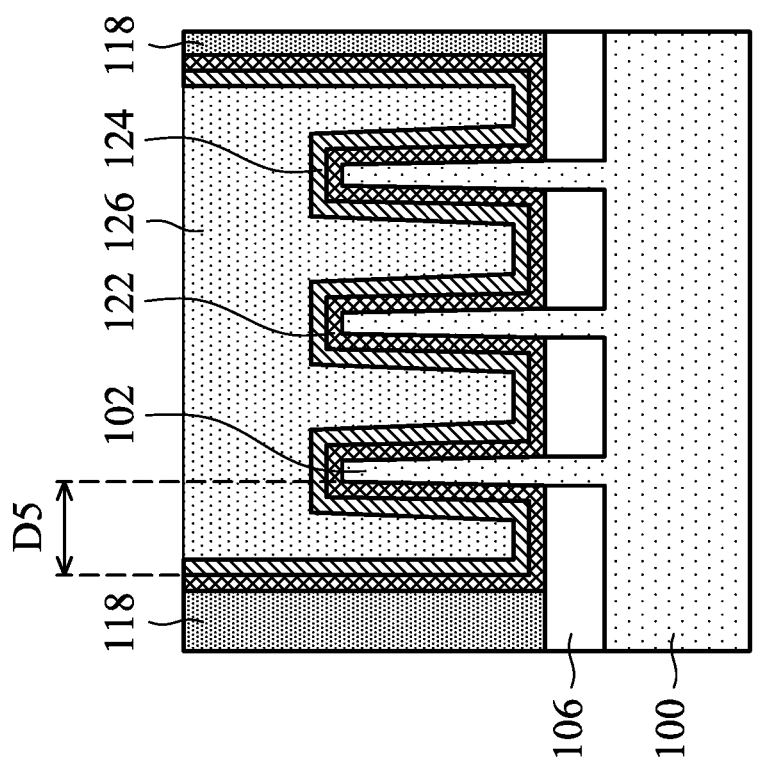

FIGS. 11A and 11B are cross-sectional views of an intermediate structure at an intermediate stage in another example process of forming one or more FinFETs in accordance with some embodiments. In some examples, varying fin-to-gate sidewall distances in regions the substrate 100 can be used for Vt tuning.

As shown in FIGS. 11A and 11B, the fins 102 can be formed having a same height. The dummy gate structures 112 can be formed as previously described. In some examples where the dummy gate structures 112 are patterned as separate dummy gate structures 112 with separation regions 104, the patterning can form sidewalls of the dummy gate structures 112 at the separation region 104 with varying distances to the nearest fin 102 that the respective dummy gate structure 112 is over. Processing can then continue as described with respect to FIGS. 5A-5B through 8A-8B.

In some examples where individual dummy gate structures 112 are formed across multiple regions and cut after, e.g., the first ILD is formed, the gate cut that forms the separation regions 104 can form respective cut openings that are varying distances from nearest fins 102 such that the dielectric structures 118 (e.g., gate-cut fill structures) are varying distances from nearest fins 102. Processing can proceed as described with respect to FIGS. 7A-7B through 8A-8B.

In still other examples where individual dummy gate structures 112 are formed across multiple regions, the dummy gate structures 112 can be removed and replaced with replacement gate structures as described previously, and a gate cut can be performed on the replacement gate structures. The gate cut that forms the separation regions 104 can form respective cut openings that are varying distances from nearest fins 102 such that the dielectric structures 118 (e.g., gate-cut fill structure) are varying distances from nearest fins 102.

As shown in FIGS. 11A and 11B, the distance from (i) an outermost sidewall of the replacement gate structure that is parallel to the longitudinal axes of the fins 102 to (ii) the nearest fin 102 that the replacement gate structure is over (e.g., the "fin-to-gate sidewall distance") in the region shown in FIG. 11A is greater than a corresponding fin-to-gate sidewall distance in the region shown in FIG. 1B. As illustrated, when the dummy gate structures 112 are patterned with the separation regions 104 between separate dummy gate structures 112 and/or when the dummy gate structures 112 are cut after, e.g., depositing the first ILD, an outermost sidewall of the replacement gate structure is an outermost sidewall of the one or more optional conformal layers 124, which are metal. In other examples, when the replacement gate structure is cut, an outermost sidewall of the replacement gate structure can be an outermost sidewall of the one or more optional conformal layers 124 and an outermost sidewall of the gate metal fill 126, which would be co-planar due to the cutting. As illustrated, a fifth distance D5 is between an outermost sidewall of the replacement gate structure and the nearest fin 102 in the region of FIG. 11A, and a sixth distance D6 is between an outermost sidewall of the replacement gate structure and the nearest fin 102 in the region of FIG. 11B. The fifth distance D5 is greater than the sixth distance D6, which may be used to implement different Vts between the devices formed in the different regions.

Although two substrate portions having two different fin-to-gate sidewall distances are shown in FIGS. 11A and 11B, in some examples, more than two portions of the substrate 100 can be formed with device structures having more than two different fin-to-gate sidewall distances. Further, devices having varying fin-to-gate sidewall distances, as shown in FIGS. 11A and 11B, can implement any aspect or combination of aspects of any of the foregoing examples for Vt tuning.

Although not shown in the figures, processing of the intermediate structures can continue following the processes described above. A second ILD can be formed on the first ILD and dielectric structure 118 and over the replacement gate structures. The second ILD may include materials such as TEOS oxide, un-doped silicate glass, doped silicon oxide such as BPSG, FSG, PSG, BSG, and/or other suitable dielectric materials deposited by any suitable deposition technique. Respective openings can be formed through the second ILD and first ILD to the source/drain regions. The openings may be formed using suitable photolithography and etch processes. Conductive features may be formed in openings to the epitaxy source/drain regions. The conductive features can include a conformal adhesion and/or barrier layer along sidewalls of the opening (e.g., sidewalls of the first ILD and the second ILD) and a conductive fill material on the adhesion and/or barrier layer to fill the openings. The adhesion and/or barrier layer may be or comprise, for example, titanium, cobalt, nickel, titanium nitride, titanium oxide, tantalum nitride, tantalum oxide, the like or a combination thereof. The conductive fill material may be or comprise tungsten, copper, aluminum, gold, silver, alloys thereof, the like, or a combination thereof. Silicide regions may also be formed on upper portions of the epitaxy source/drain regions. The silicide regions may be formed by reacting upper portions of the epitaxy source/drain regions with the adhesion and/or barrier layer. An anneal can be performed to facilitate the reaction of the epitaxy source/drain regions with the adhesion and/or barrier layer. After the conductive fill material for the conductive features is deposited, excess material may be removed by using a planarization process, such as a CMP, to form top surfaces of the conductive features coplanar with the top surface of the second ILD. The conductive features may be referred to as contacts, plugs, etc.

In some examples, the techniques described herein for using different geometries for Vt tuning can be used in combination with techniques involving use of various work function tuning layers. For example, for a target tuning window and number of desired work functions for different devices, a number of different work function tuning layers can be used and the geometries can be varied to further tune the work functions. Thus, multiple different work functions can be achieved using a smaller number of work function tuning layers.

Figure 12:
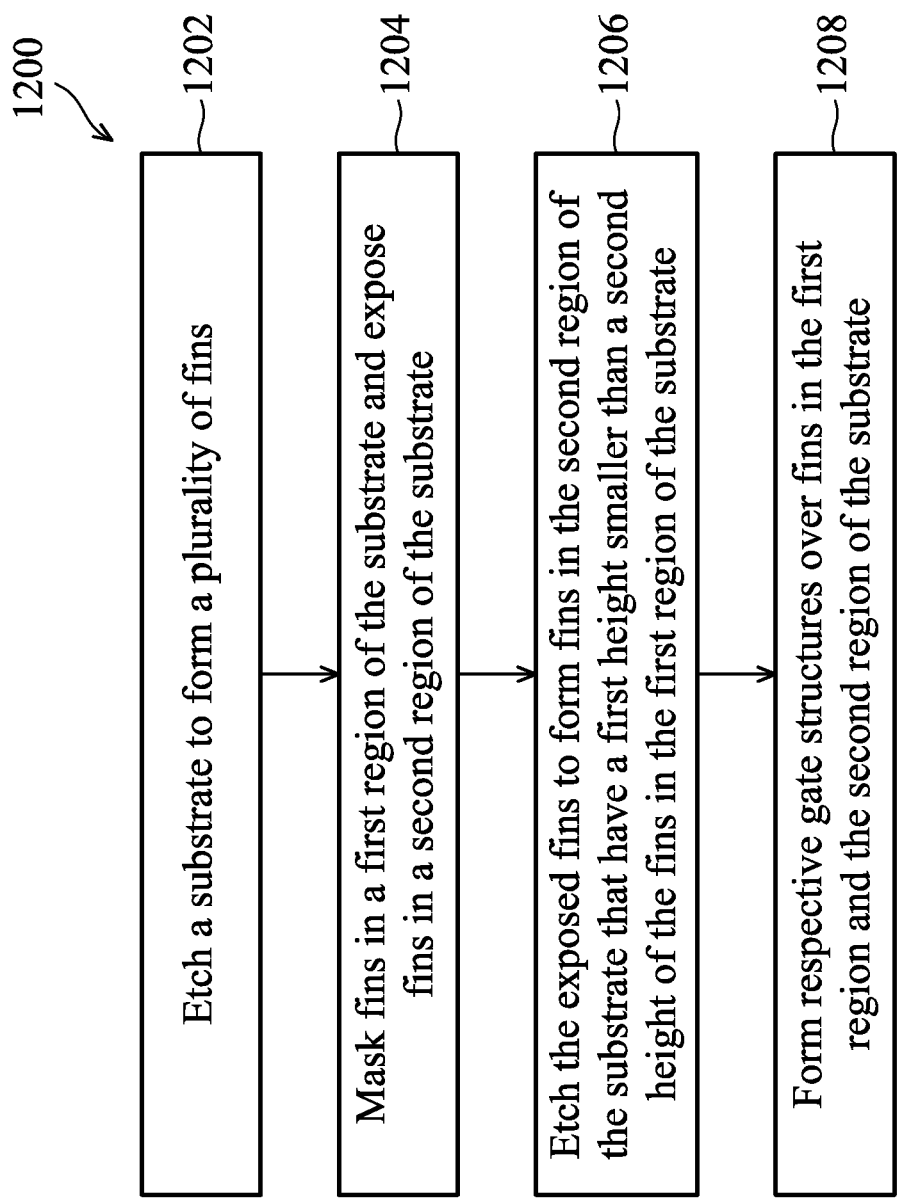
FIG. 12 is a flow chart illustrating example operations for forming device structures with fins, where distances between tops of fins and tops of gate structures vary, in accordance with some embodiments.

FIG. 12 is a flow chart illustrating example operations 1200 for forming device structures with fins, where distances between tops of fins and tops of gate structures vary, in accordance with some embodiments. As shown in FIG. 12, at operation 1202, the substrate 100 is etched to form a plurality of fins 102 as shown in FIGS. 2A and 2B. At operation 1204, the fins 102 in a first region of the substrate 100 are masked, as shown in FIG. 2A, and the fins 102 in a second region of the substrate 100 are exposed, as shown in FIG. 2B. At operation 1206, the exposed fins 102 are etched to form fins in the second region of the substrate 100 that have a first height, as shown in FIG. 3B, that is smaller than a second height of the fins 102 in the first region of the substrate 100, as shown in FIG. 3A. In other examples, the fins 102 can be exposed, as in operation 1204, and etched, as in operation 1206, after removing a dummy gate structure as described above. At operation 1208, respective gate structures are formed over the fins 102 in the first region and second region of the substrate 100, as shown in FIGS. 8A and 8B.

Figure 13:
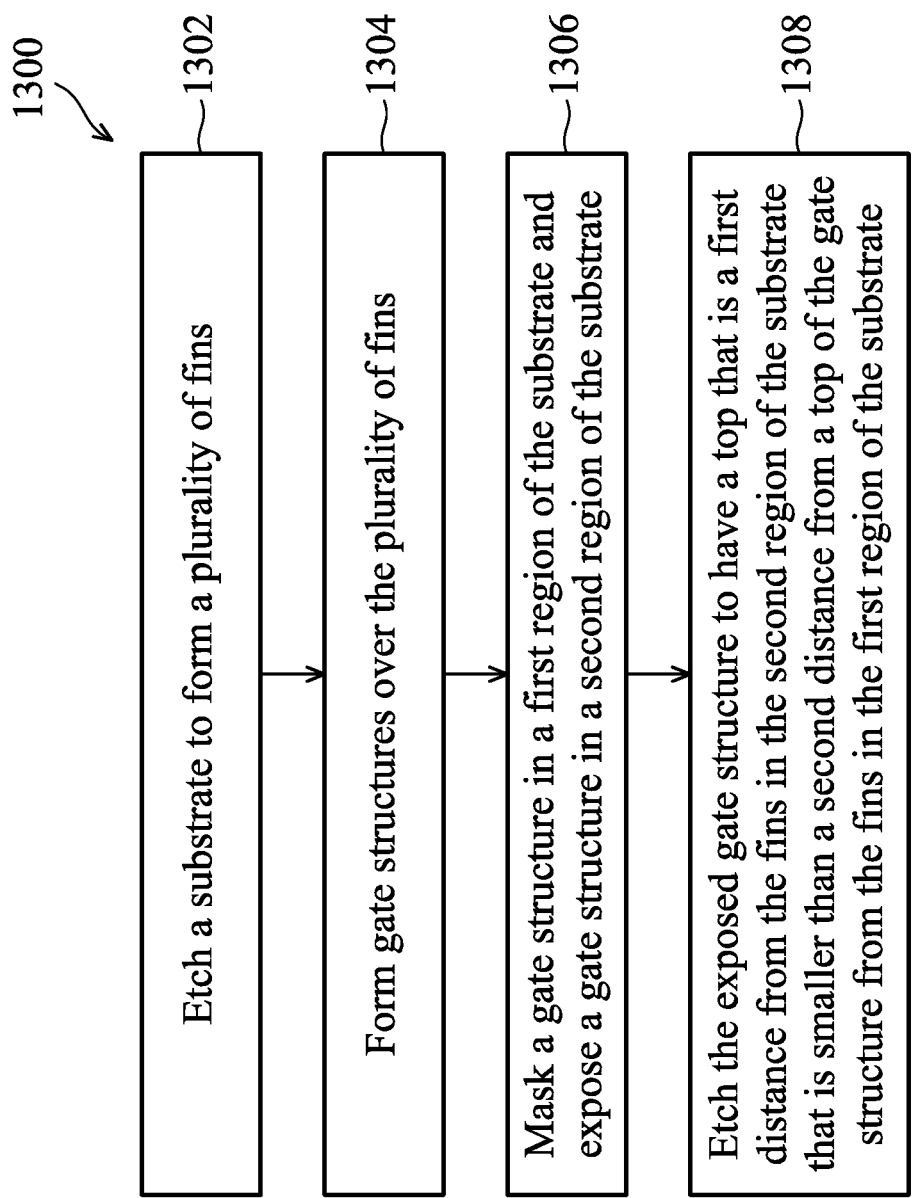
FIG. 13 is a flow chart illustrating example operations for forming device structures with fins, where distances between tops of fins and tops of gate structures vary, in accordance with some embodiments.

FIG. 13 is a flow chart illustrating example operations 1300 for forming device structures with fins, where distances between tops of fins and tops of gate structures vary, in accordance with some embodiments. As shown in FIG. 13, at operation 1302, the substrate 100 is etched to form a plurality of fins 102. At operation 1304, gate structures are formed over the plurality of fins 102, such as shown in FIGS. 8A and 8B. At operation 1306, a gate structure in a first region of the substrate is masked, as shown in FIG. 9B, and a gate structure in a second region of the substrate is exposed, as shown in FIG. 9A. At operation 1308, the exposed gate structure is etched to have a top that is a first distance from the fins 102 in the second region of the substrate 100, as shown in FIG. 9A, that is smaller than a second distance from a top the gate structure from the fins 102 in the first region of the substrate 100, as shown in FIG. 9B.

Figure 14:
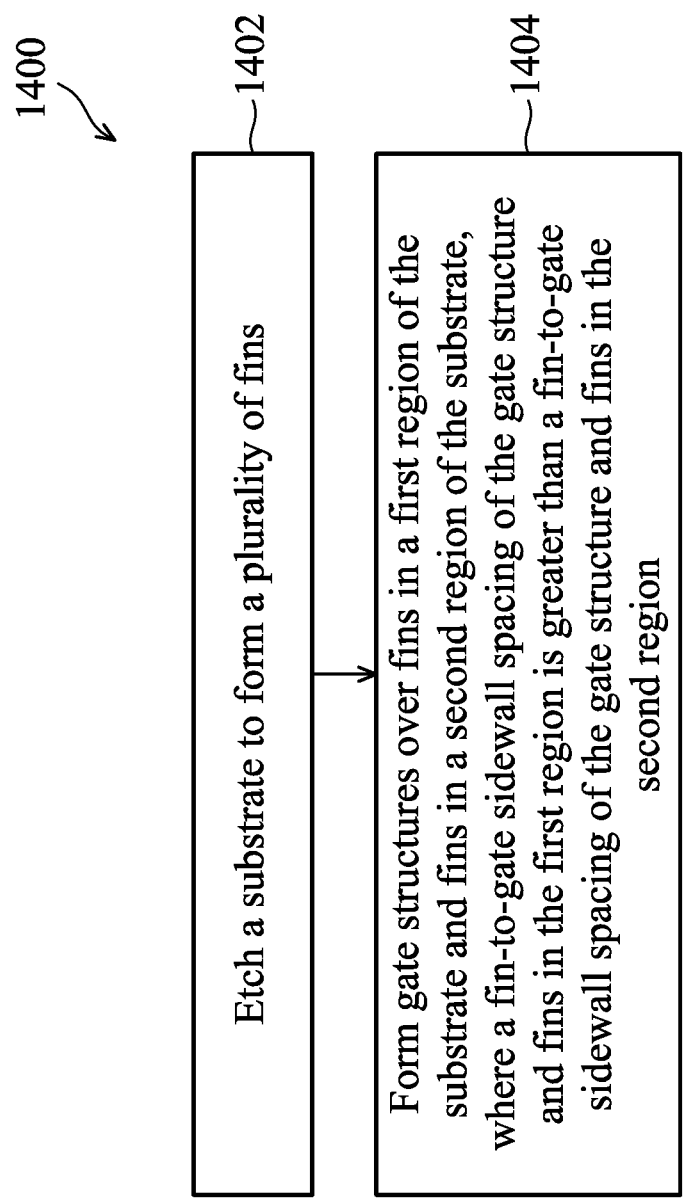
FIG. 14 is a flow chart illustrating example operations for forming device structures having varying fin-to-gate sidewall distances in accordance with some embodiments.

FIG. 14 is a flow chart illustrating example operations 1400 for forming device structures having varying fin-to-gate sidewall distances in accordance with some embodiments. As shown in FIG. 14, at operation 1402, the substrate 100 is etched to form a plurality of fins 102. At operation 1404, respective gate structures are formed over fins 102 in a first region, as shown in FIG. 11A, and fins 102 in a second region, as shown in FIG. 1B. A fin-to-gate sidewall distance of the gate structure and fins in the first region is greater than a fin-to-gate sidewall distance of the gate structure and fins in the second region. The location of the sidewalls of the gate structures may result from patterning gate structures (e.g., dummy gate structures) or cutting gate structures, as previously described.

Although not intended to be limiting, one or more embodiments of the present disclosure can provide many benefits to a semiconductor device and the formation thereof. For example, embodiments of the present disclosure provide methods for a larger Vt tuning window in a replacement gate process, for example, which may obviate using multiple different work function tuning layers to achieve the Vt tuning. The fin height and/or gate heights can be formed/etched to form areas on the substrate with different top-of-fin to top-of-gate distances to adjust the Vt. Alternatively or in addition, fin-to-gate sidewall distance can be varied to adjust the Vt.

In an embodiment, a structure includes a first fin on a substrate, a second fin on the substrate, a first gate structure over the first fin, and a second gate structure over the second fin. A first distance is from a top of the first fin to a top of the first gate structure. A second distance is from a top of the second fin to a top of the second gate structure. The first distance is greater than the second distance.

Another embodiment is method for semiconductor processing. At least a first fin and a second fin are defined by etching trenches in a substrate. One or more layers are deposited to form a first gate structure and a second gate structure. The first gate structure is formed over the first fin and the second gate structure is formed over the second fin. Respective tops of the first and second gate structures are planarized. A first distance is from the tops of the first and fins to a top of the planarized tops of first and second gate structures. A second distance is from a top of the second fin to a top of the second gate structure. The top of the second gate structure is etched while the first gate structure is masked. A second distance is from the top of the second fin to the etched top of the second gate structure. The second distance is smaller than the first distance.

A further embodiment is a structure. The structure includes a substrate. The substrate has a plurality of regions. Each region includes one or more fins formed on the substrate. The structure includes a plurality of gate structures over the one or more fins in the plurality of regions. A first one or more gate structures, of the plurality of gate structures, in at least a first region of the plurality of regions has respective tops that are a first distance from respective tops of the one or more fins over which the first one or more gate structures are formed. A second one or more gate structures, of the plurality of gate structures, in at least a second region of the plurality of regions has respective tops that are a second distance from respective tops of the one or more fins over which the second one or more gate structures are formed. The second distance is smaller than the first distance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A structure comprising:
a first fin on a substrate;
a second fin on the substrate;
a first gate structure over the first fin, a first distance being from a top of the first fin to a top of the first gate structure; and
a second gate structure over the second fin, wherein the first and second gate structures are replacement gate structures, a second distance being from a top of the second fin to a top of the second gate structure, the first distance being greater than the second distance.

2. The structure of claim 1, wherein the top of the first gate structure is not coplanar with the top of the second gate structure.

3. The structure of claim 1, wherein a height of the first fin is equal to a height of the second fin.

4. The structure of claim 1, further comprising a dielectric cap over the second gate structure, a top of the dielectric cap being coplanar with the top of the first gate structure.

5. The structure of claim 1, wherein each replacement gate structure comprises a conformal gate dielectric layer, a work function tuning layer over the conformal gate dielectric layer, and a conductive fill material over the work function tuning layer.

6. The structure of claim 1, wherein the first gate structure is associated with a first threshold voltage, and wherein the second gate structure is associated with a second threshold voltage, different than the first threshold voltage.

7. The structure of claim 1, further comprising a third fin on the substrate, and a third gate structure over the third fin, a third distance being from a top of the third fin to the third gate structure, the third distance being different than the first distance and the second distance.

8. A structure comprising:
a substrate comprising a plurality of regions, each region comprising one or more fins formed on the substrate; and
a plurality of gate structures over the one or more fins in the plurality of regions, wherein:
first one or more gate structures, of the plurality of gate structures, in at least a first region of the plurality of regions have respective tops a first distance from respective tops of the one or more fins over which the first one or more gate structures are formed,
second one or more gate structures, of the plurality of gate structures, in at least a second region of the plurality of regions have respective tops a second distance from respective tops of the one or more fins over which the second one or more gate structures are formed, the second distance being smaller than the first distance, and
a third one or more gate structures over the one or more fins in a third region of the plurality of regions, tops of the third one or more gate structures having a third distance from respective tops of the one or more fins over which the third one or more gate structures are formed, the third distance different than the first and second distances.

9. The structure of claim 8, wherein the tops of the first one or more gate structures are not coplanar with the tops of the second one or more gate structures.

10. The structure of claim 8, wherein heights of the one or more fins in the at least the first region are equal to heights of the one or more fins in the at least the second region.

11. The structure of claim 8, further comprising a dielectric cap over the one or more second gate structures, a top of the dielectric cap being coplanar with the top of the first one or more gate structures.

12. The structure of claim 8, wherein the first and second one or more gate structures are replacement gate structures, each replacement gate structure comprising a conformal gate dielectric layer, a work function tuning layer over the conformal gate dielectric layer, and a conductive fill material over the work function tuning layer.

13. The structure of claim 8, wherein the first one or more gate structures are associated with a first threshold voltage, and wherein the second one or more gate structures are associated with a second threshold voltage, different than the first threshold voltage.

14. The structure of claim 8, wherein heights of the one or more fins in the at least the first region are different than heights of the one or more fins in the at least the second region.

15. A structure comprising:
- a first fin on a substrate, the first fin having a first upper surface;
- a second fin on the substrate, the second fin having a second upper surface, the first upper surface being level with the second upper surface;
- a first gate structure over the first fin, a first distance being a shortest measured distance from the first upper surface of the first fin to an upper surface of the first gate structure;
- a second gate structure over the second fin, a second distance being a shortest measured distance from the second upper surface of the second fin to an upper surface of the second gate structure, the first distance being larger than the second distance; and
- isolation regions along opposing sides of the first fin and the second fin, wherein an upper surface of the isolation regions adjacent the first fin is level with an upper surface of the isolation regions adjacent the second fin.

16. The structure of claim 15 further comprising a dielectric cap over the second fin, wherein a third distance is a shortest distance from the upper surface of the second fin to an upper surface of the dielectric cap, wherein the third distance is substantially the same as the first distance.

17. The structure of claim 15 further comprising:
- a dielectric cap over the second fin; and
- dielectric structures along opposing sides of the first gate structure and the second gate structure, wherein an upper surface of the dielectric cap, the upper surface of the first gate structure, and an upper surface of the dielectric structures are level.

18. The structure of claim 15, wherein the first gate structure comprises one or more first conductive layers, wherein the second gate structure comprises the one or more first conductive layers.

19. The structure of claim 15, wherein the first gate structure is associated with a first threshold voltage, and wherein the second gate structure is associated with a second threshold voltage, different than the first threshold voltage.

20. The structure of claim 15, wherein an upper surface of the first fin is offset from an upper surface of the second fin.

\* \* \* \* \*